May 9, 1961 G. L. PEARSON 2,983,854
SEMICONDUCTIVE DEVICE
Filed April 5, 1960

INVENTOR
G. L. PEARSON
BY Arthur J. Torsiglieri
ATTORNEY

United States Patent Office
2,983,854
Patented May 9, 1961

2,983,854

SEMICONDUCTIVE DEVICE

Gerald L. Pearson, Bernards Township, Somerset County, N.J., assignor to Bell Telephone Laboratories, Incorporated, New York N.Y., a corporation of New York Filed Apr. 5, 1960, Ser. No. 20,117
4 Claims. (Cl. 317—235)

This invention relates to semiconductive devices and more particularly to tunnel or Esaki diodes.

Tunnel diodes are devices which include a semiconductive wafer having therein a p-n junction with a narrow transition layer, typically about 100 Angstroms. This transition layer separates two degenerate regions of opposite conductivity type between which quantum mechanical tunneling occurs with a consequent negative resistance effect at an appropriate value of forward bias across the junction.

In many circuits there is a need for an arrangement of two tunnel diodes connected in series-aiding relation with either substantially identical characteristics or different characteristics.

An object of the invention is an improved arrangement for providing a pair of tunnel diodes in a series-aiding relation.

In particular, the invention provides an integrated device comprising only a single semiconductive wafer which can be used as a pair of tunnel diodes in series-aiding relation.

An important advantage of this integrated device is that its total inductance is no more than that usually associated with a single diode and accordingly less than that of a series of two diodes. As is known, one of the more serious problems associated with the use of tunnel diodes at high frequencies is the need to keep the inductance of the associated circuitry low.

Specifically, an illustrative embodiment of the invention comprises a semiconductive wafer whose bulk is of high resistivity and which includes both a p-type degenerate diffused layer and an n-type degenerate diffused layer spaced apart on the surface of the wafer. A conductive surface film forms a low resistance connection between the two layers. Additionally, the wafer includes an n-type degenerate alloy region contiguous with the p-type diffused layer for forming a first rectifying junction which exhibits the tunnel effect and a p-type degenerate alloy region contiguous with the n-type diffused layer for forming a second rectifying junction which exhibits the tunnel effect. Separate electrodes are connected to the two alloy regions. Optionally, an electrode can be connected to the conductive surface film to serve as a center tap between the two diodes.

Figure 1:
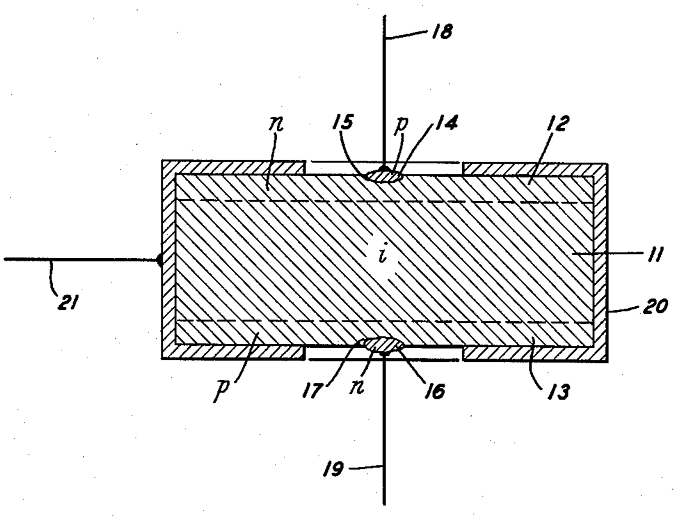
Figure 2:
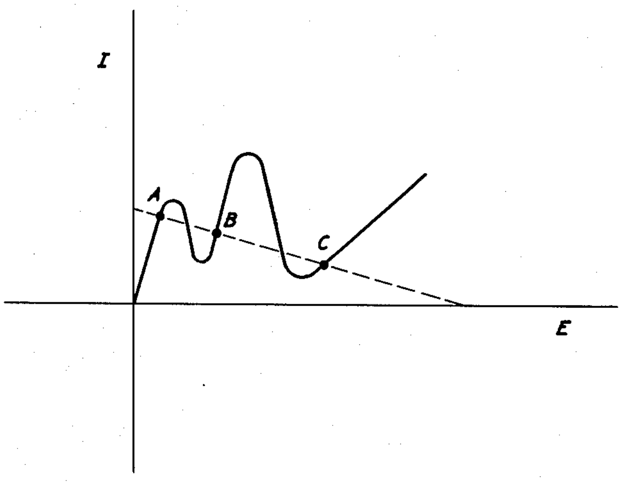

The invention will be better understood from the following more detailed description, taken with the accompanying drawing, in which:

Fig. 1 shows a cross section of an illustrative embodiment of the invention; and Fig. 2 shows the voltage-current characteristic of an embodiment of the invention in which the individual diode elements have different operating parameters.

With reference now to the drawing, the device 10 shown in Fig. 1 comprises a semiconductive wafer 11 whose bulk interior portion is of high resistivity and which includes on opposite major faces large area low resistivity layers 12 and 13 of opposite conductivity type. Each of these layers, at least over a portion of their thickness, typically the portion contiguous to the surface, is of degenerate material.

By definition n-type degenerate material is material in which the characteristic Fermi level lies above the bottom of the conduction band, and p-type degenerate material is material in which the Fermi level lies below the top of the valence band. The bulk portion 11 being of high resistivity is nondegenerate. In nondegenerate material the Fermi level lies in the gap between the valence and conduction bands.

Additionally, the wafer includes a small area degenerate surface p-type region 14 which forms a p-n rectifying junction 15 with the degenerate portion of n-type surface layer 12 and a small area degenerate surface n-type region 16 which forms a p-n rectifying junction 17 with the degenerate portion of the p-type surface layer 13. In particular, junctions 16 and 17 are each designed to exhibit the "tunnel" effect. To this end, the transition region associated with each of these junctions is narrow, typically about 100 Angstroms thick.

Electrode 18 makes low resistance connection to region 14, and electrode 19 makes low resistance connection to region 16. Highly conductive surface layer 20, which covers the surface of the wafer except for portions corresponding to regions 14 and 16, provides a low resistance connection between layers 12 and 13. An electrode 21 makes low resistance connection to layer 20.

Any of the known techniques for forming tunnel diodes consistent with the invention can be employed.

Typically, the described device can be as follows: The semiconductive wafer can be monocrystalline germanium, and its bulk can have a resistivity of about 50 ohms-centimeter either p- or n-type. The dimensions of the wafer can be 20 mils square and ten mils thick. Layer 12 can be formed by arsenic diffusion in known manner to have a thickness of about one mil and an average arsenic concentration of about $5\times10^{19}$ atoms per cubic centimeter. The concentration will be highest at the surface and decrease with increasing penetration below the surface. Layer 13 can be formed by gallium diffusion also to have a thickness of about one mil and an average diffusant concentration of about $3\times10^{19}$ atoms per cubic centimeter. Region 14 can be formed by alloying in known manner a pellet about one to three mils in diameter and of 99.3 percent indium and .7 percent gallium by weight. Region 16 can be formed by alloying in known manner a pellet also about one to three mils in diameter and of 70 percent tin and 30 percent arsenic by weight. The conductive film 20 can be a layer of gold a mil thick.

The characteristics of each diode can be controlled separately. A variety of parameters are available for control for each diode. However, the most convenient to control is usually the concentration of the diffusant in the diffused layer, particularly when the diffusant is introduced from a coating applied to the surface. In such instance, control of the concentration of the diffusant in the surface coating provides control of the concentration in the diffused layer. If the diffusant is introduced from a vapor phase, control of the concentration in the vapor provides control of the amount introduced. Similarly, by introducing one diffusant first at a particular diffusion temperature and subsequently introducing the other at the same or a different temperature, separate control of diffusion depth and concentration of each of the two diffused layers is feasible. Various other techniques will be obvious, including control of the composition of alloy pellets employed, as by the use of diluents such as lead and tin.

Often it is desirable to provide that the two diodes have identical characteristics. This can be achieved by appropriate control as described.

On the other hand, there are instances when it is desirable to provide different characteristics to the two diodes. Fig. 2 shows the characteristic measurable between electrodes 18 and 19 when the two diodes are dissimilar. The broken line represents a typical load line. As seen, it intersects the characteristic at the three stable points, A, B and C. Accordingly, the resultant device is tristable.

The characteristics shown can be achieved simply by providing that one diode exhibit a peak tunneling current, i.e., the switching current, which is lower than the other and utilizing a constant current generator as the power supply. To this end, the voltage supply should have an internal resistance substantially higher, typically at least ten times, the resistance of the diodes. In such a case, when the tunneling current of such first diode passes its peak, there will follow the first negative resistance region shown. Subsequently, when the tunneling current of the second diode passes its peak, there will follow the second negative resistance.

Control of the peak tunneling current can be achieved most simply by controlling, as by etching, the size of the junction subject to tunneling. The larger the area of the junction over which tunneling occurs the larger the peak or switching current.

Various modifications are, of course, possible in the embodiments described consistent with the principles of the invention. For example, there may be used various other semiconductive materials, such as the silicon, silicon-germanium alloys, indium arsenide, indium antimonide, gallium arsenide, gallium antimonide, and other binary and ternary semiconductors. Additionally, the geometry may be varied as, for example, using different portions of a common face of a semiconductive wafer in which to form the separate diodes.

What is claimed is:

1. A semiconductive device comprising a semiconductive wafer including a high resistivity bulk portion, first and second spaced low resistivity surface portions respectively of opposite conductivity type, a first region contiguous with the first surface portion and forming a first rectifying junction therewith which exhibits tunneling, a second region contiguous with the second surface portion and forming a second rectifying junction which exhibits tunneling, separate electrodes to said first and second regions, and a low resistance surface layer interconnecting said first and second surface portions.

2. A semiconductive device comprising a semiconductive wafer including a high resistivity bulk portion, first and second spaced low resistivity impurtiy-diffused surface portions of opposite conductivity type, a first alloy region contiguous with the first diffused portion and forming a first rectifying junction therewith which exhibits tunneling, a second alloy region contiguous with the second diffused portion and forming a second rectifying junction therewith which exhibits tunneling, separate electrodes to said first and second alloy regions and a metallic surface layer interconnecting said first and second surface portions.

3. The semiconductive device of claim 2 in which said first and second impurity-diffused surface portions are on opposite surfaces of the wafer.

4. A semiconductive device according to claim 3 in which the semiconductive wafer is germanium, the first alloy region is a germanium-arsenic-tin alloy and the second alloy region is a germanium-indium-gallium alloy region.

References Cited in the file of this patent

UNITED STATES PATENTS 2,918,628 Stuetzer ---------------- Dec. 22, 1959